United States Patent
Kimura et al.

(10) Patent No.: US 9,382,603 B2
(45) Date of Patent: Jul. 5, 2016

(54) METAL TAPE MATERIAL AND INTERCONNECTOR FOR SOLAR MODULE CURRENT COLLECTION

(75) Inventors: Keiichi Kimura, Tokyo (JP); Masamoto Tanaka, Tokyo (JP); Wataru Ohashi, Tokyo (JP)

(73) Assignee: NIPPON STEEL & SUMITOMO METAL CORPORATION, Tokyo (JP)

( * ) Notice: Subject to any disclaimer, the term of this patent is extended or adjusted under 35 U.S.C. 154(b) by 190 days.

(21) Appl. No.: 13/635,216

(22) PCT Filed: Mar. 17, 2011

(86) PCT No.: PCT/JP2011/057267
§ 371 (c)(1),
(2), (4) Date: Sep. 14, 2012

(87) PCT Pub. No.: WO2011/115305
PCT Pub. Date: Sep. 22, 2011

(65) Prior Publication Data
US 2013/0008692 A1  Jan. 10, 2013

(30) Foreign Application Priority Data
Mar. 17, 2010  (JP) .................. 2010-061240

(51) Int. Cl.
*B21B 1/22* (2006.01)
*C22F 1/00* (2006.01)
(Continued)

(52) U.S. Cl.
CPC ... *C22F 1/00* (2013.01); *B21B 3/00* (2013.01); *B23K 35/26* (2013.01); *C22C 9/00* (2013.01);
(Continued)

(58) Field of Classification Search
USPC .................. 148/432–436; 420/469–500, 591; 174/137 R, 133 R
IPC ........ B21B 1/40,2267/065, 3/00; B22F 1/0059; B23K 35/26
See application file for complete search history.

(56) References Cited

U.S. PATENT DOCUMENTS 4,086,082 A * 4/1978 Mahalla ........................ 428/357
2009/0165899 A1  7/2009 Sakai et al.

FOREIGN PATENT DOCUMENTS

JP  10195609 A  *  7/1998
JP  11-286760 A  10/1999
(Continued)

OTHER PUBLICATIONS

Information Statement mailed on Oct. 23, 2012, for Japanese Application No. 2011-539818.
(Continued)

*Primary Examiner* — Sikyin Ip
(74) *Attorney, Agent, or Firm* — Birch, Stewart, Kolasch & Birch, LLP

(57) ABSTRACT

A metal tape material contains a metal having face centered cubic lattice structure, in which metal tape material an area fraction A1 of a preferentially <100>oriented region are within an orientation difference of 15° C. relative to a thickness direction of the metal tape material and further within an orientation difference of 15° C. relative to a first in-plane direction of the metal tape material is 60% or greater and not greater than 100%, and, where an area fraction of a preferentially <212>oriented region are within an orientation difference of 15° relative to the thickness direction and further within an orientation difference of 15° relative to the first in-plane direction is defined as A2, the total of the area fraction of the preferentially <212>oriented region and the area fraction of the preferentially <100>oriented region, A1+A2, is greater than 70% and not greater than 100%.

6 Claims, 5 Drawing Sheets

(51) Int. Cl.

| | | |
|---|---|---|
| *B21B 3/00* | (2006.01) | |
| *B23K 35/26* | (2006.01) | |
| *C22C 13/00* | (2006.01) | |
| *C22F 1/04* | (2006.01) | |
| *C22F 1/08* | (2006.01) | |
| *C22F 1/14* | (2006.01) | |
| *C22C 9/00* | (2006.01) | |
| *C22C 9/06* | (2006.01) | |
| *C22C 21/00* | (2006.01) | |
| *H01L 31/05* | (2014.01) | |
| *B21B 1/40* | (2006.01) | |
| *B22F 1/00* | (2006.01) | |

(52) U.S. Cl.
CPC . *C22C 9/06* (2013.01); *C22C 13/00* (2013.01); *C22C 21/00* (2013.01); *C22F 1/04* (2013.01); *C22F 1/08* (2013.01); *C22F 1/14* (2013.01); *H01L 31/0512* (2013.01); *B21B 1/40* (2013.01); *B21B 2267/065* (2013.01); *B22F 1/0059* (2013.01); *Y02E 10/50* (2013.01); *Y10T 428/12493* (2015.01)

(56) References Cited

FOREIGN PATENT DOCUMENTS

| JP | 3009383 B2 | 12/1999 |
|---|---|---|
| JP | 2001-262224 A | 9/2001 |
| JP | 2005-211948 A | 8/2005 |
| JP | 2006-80217 A | 3/2006 |
| JP | 2006-117977 A | 5/2006 |
| JP | 2006-319002 A | 11/2006 |
| JP | 2007-107038 A * | 4/2007 |
| JP | 2007-107038 A | 4/2007 |
| JP | 2008-21831 A | 1/2008 |
| JP | 2008-38169 A | 2/2008 |
| JP | 2008-63623 A | 3/2008 |
| JP | 2008-168339 A | 7/2008 |
| JP | 2009-120926 A | 6/2009 |
| JP | 2009-185341 A | 8/2009 |
| JP | 2010-34541 A | 2/2010 |
| TW | 221525 B | 3/1994 |
| TW | 200837969 A | 9/2008 |
| WO | WO 91/18419 A1 | 11/1991 |
| WO | WO 2007/148712 A1 | 12/2007 |
| WO | WO 2008/080160 A1 | 7/2008 |

OTHER PUBLICATIONS

Ono et al., "Technical Trends of Copper Foils and Applications," Journal of Japan Research Institute for Advanced Copper-Base Materials and Technologies, Japan Copper and Brass Association, vol. 45, No. 1, Aug. 1, 2006, pp. 6-10.

Sudo, "Metallography," Maruzen Inc., Aug. 31, 1972, pp. 122-127.

International Search Report dated Jul. 29, 2011 (Forms PCT/ISA/210, PCT/IB/301and PCT/IB/304), PCT/JP2011/057267.

Yuju Endo et al.; Development of Solder Coated and Super Soft Annealed Copper Wire for Photovoltaic System; Technical Report, Scientific Society; pp. 15-18; No. 26; Jan. 2007.

* cited by examiner

METAL TAPE MATERIAL AND INTERCONNECTOR FOR SOLAR MODULE CURRENT COLLECTION

CROSS-REFERENCE TO RELATED APPLICATIONS

This application is a continuation of a 371 PCT/JP11/057267, filed Mar. 17, 2011, which claims the benefit of priority from Japanese Patent Application No. 2010-061240, filed Mar. 17, 2010, the entire contents of which are incorporated herein by reference.

TECHNICAL FIELD

This invention relates to a metal tape material. More specifically, it relates to a metal tape material used for semiconductor packaging and particularly relates to an interconnector for solar module current collection.

BACKGROUND ART

Solar module power generation is a method of generating power by directly converting inexhaustible solar energy into electric energy. Viewed as a technology for significantly alleviating energy issues, solar module power generation has therefore been intensely researched and developed in recent years, and its market has also expanded considerably.

Currently, single-crystal silicon substrates and polycrystal silicon substrates are widely used for the substrates of solar modules. A solar module that uses a single-crystal silicon substrate or the like is formed of a number of substrates called solar cells of a size of some tens of centimeters square. The multiple solar cells forming the solar module are interconnected by collector wires for collecting the electrical energy generated by the individual solar cells. Molten phase bonding with solder is widely adopted for the connections between the solar cells and the collector wires. The collector wire is known as an interconnector for current collection and is formed from solder-coated flat copper wire. Flat copper wire is generally produced by rolling round wire to form flat wire (metal tape). Owing to such a production method, the flat copper wire can be produced in a thin and elongated shape.

On the other hand, the solar module is an energy device that outputs electric power as electric current. From this it follows that the cross-sectional area of the interconnector for current collection and the area of the bonding surface between the interconnector for current collection and the solar cells need to be determined with consideration to the amount of current flowing through the interconnector for current collection.

In order to bond the interconnector for current collection to a solar cell, it is necessary to perform processing for heating and joining the interconnector for current collection and the solar cell by liquid-phase bonding, followed by cooling to room temperature. In this process, thermal stress occurs because of the difference between the coefficient of thermal expansion of the silicon that is the main component constituting the solar cell and the coefficient of thermal expansion of the copper that is the main component constituting the interconnector for current collection. The typical coefficients of linear thermal expansion of metal and silicon in the vicinity of room temperature are $16.6 \times 10^{-6}$ ($K^{-1}$) for copper, $19 \times 10^{-6}$ ($K^{-1}$) for silver, $25 \times 10^{-6}$ ($K^{-1}$) for aluminum, and $3 \times 10^{-6}$ ($K^{-1}$) for silicon. When copper and silicon are bonded at 200° C., a length difference of about 0.26% arises. And this length difference produces thermal stress and warping between the copper and the silicon. As pointed out earlier, the ratio between the coefficient of thermal expansion of copper and the coefficient of thermal expansion of silicon is large, at around 5 fold, so that the thermal stress produced may deform or break the solar cell. On the other hand, in order to cope with tight silicon material supplies and lower the cost of solar modules, the thickness of substrates used in solar cells is being reduced. For example, very thin silicon substrates of 180 μm-order thickness have come to be used in solar cells. Breakage of solar cells by thermal stress has therefore become a still greater problem.

Attempts have been made to overcome this problem by softening the interconnector for current collection (see, for example, Non-patent Document 1). In order to deal with the problem caused by difference in coefficient of thermal expansion between metal and silicon, it is important to soften the interconnector for current collection, i.e., to lower its Young's modulus and yield stress. In general, 0.2% proof stress is usually used as the definition of yield stress. Also in the case of an interconnector for current collection, strain can be expected to be induced on the order of around 0.2%. So lowering the 0.2% proof stress is to allow the metal side to yield, experience thermal stress, and warp. The method generally used to soften a metal is to lower dislocation density by annealing. However, reduction of 0.2% proof stress by anneal-softening has its limit, so that it has been difficult to keep pace with further thickness reduction of solar cell substrates. In light of this, various technologies have been proposed for improving current-collection interconnector structure and packaging, and also for collection system control (see, for example, Patent Documents 1 to 3).

The invention taught by Patent Document 1 relieves stress by forming wavy zones in the longitudinal direction of the interconnector for current collection. Further, the invention taught by Patent Document 2 reduces thermal stress in the cooling process following current-collection interconnector bonding, by forming non-contact regions not formed with electrodes at desired intervals in the longitudinal direction of the solar cell electrodes. In addition, so as to lower 0.2& proof stress, the invention taught by Patent Document 3 aligns the crystallographic orientation (plating wire axis direction) of the conductor core in the (211) plane at a ratio of 30% or greater, thereby decreasing solar module warping.

A technique that mitigates thermal stress by modifying the connecting structure between the solar cell and the interconnector for current collection is very effective. However, the technique taught by Patent Document 1 increases the length of the required interconnector for current collection, so that it increase the materials cost of the interconnector for current collection and may also increase its electrical resistance. Further, since the techniques taught by Patent Documents 1 and 2 reduce the bonding area between the solar cell and the interconnector for current collection, connection resistance rises and the electrical resistance of the bond region (notch region) may also increase. Therefore, aside from such techniques, a strong need is felt for improvement of the mechanical properties of the interconnector for current collection by making the material itself of the interconnector for current collection lower in Young's modulus and lower in yield stress. It should be noted that a similar problem is liable to arise also in various types of solar modules other than solar modules that use polycrystal silicon substrates because the materials of the solar module material and the current collection conductor are different.

On the other hand, wire-bump bonding has recently been proposed in which bumps composed of metal are solder-connected on top of a wafer and used to bond metal wire or metal tape (see, for example, Patent Document 4). As thermal stress is apt to arise also in the case of performing solder connection, the same problem as pointed out above regarding the interconnector for current collection of a solar module is liable to occur.

Moreover, the metal foil used in a flexible circuit board is one example of utilizing aggregate structure to control the mechanical properties of a packaging electrical conductor other than an interconnector for current collection for a solar module (see, for example, Patent Documents 5 to 7). The method set out in Patent Document 5 requires the (200) plane intensity (I) determined by X-ray diffraction of the rolled surface to be as follows with respect to the (200) plane intensity (I0) determined by X-ray diffraction of copper fine powder: I/I0>20 or greater. This is to improve the fatigue property, i.e., the property when the foil is repeatedly bent. Further, the method set out in Patent Document 6 requires that the metal foil consist of a metal having a crystal structure of cubic system and that when cut in the thickness direction from the ridge at a bend, the principal axis of the cross-section of the interconnector, assuming the zone axis to be [001], lie in a plane included in the range of from (20 1 0) to (1 20 0) in the direction of rotation from (100) to (110). In addition, the metal foil set out in Patent Document 7 requires that the area fraction of crystal grains present within 15 degrees of the angle formed between the [100] direction of the crystal and the rolling direction be 80% or greater and the maximum grain diameter be 5 μm or less. However, there is a limit to 0.2% proof stress reduction with the metal foil set out in Patent Document 7 in which only the crystal grains oriented in the rolling direction are small in diameter.

PRIOR ART REFERENCES

Patent Documents

Patent Document 1 Unexamined Patent Publication (Kokai) No. 2006-80217
Patent Document 2 Unexamined Patent Publication (Kokai) No. 2008-21831
Patent Document 3 Unexamined Patent Publication (Kokai) No. 2008-168339
Patent Document 4 Unexamined Patent Publication (Kokai) No. 2006-319002
Patent Document 5 Patent No. 3009383
Patent Document 6 Unexamined Patent Publication (Kokai) No. 2010-34541
Patent Document 7 Unexamined Patent Publication (Kokai) No. 2007-107038

Non-Patent Document

Non-patent Document 1 Yuju ENDO et al., Hitachi Cable: 2007, Vol. 26, No. 1, p 15

SUMMARY OF THE INVENTION

Problem to be Solved by the Invention

The present invention was made to solve the aforesaid problem and has as its object to provide a metal tape material improved in mechanical properties so as to have low Young's modulus and yield stress and be high in break elongation, and a metal tape material for semiconductor packaging using the same, particularly an interconnector for solar module current collection. It is especially directed to providing a metal tape material that is low in Young's modulus and yield stress and high in break elongation in the longitudinal direction, the metal tape material, and a metal tape material for semiconductor packaging using the same, particularly an interconnector for solar module current collection.

Means for Solving the Problem (1) A metal tape material comprising a metal whose crystal structure is face centered cubic lattice structure, which metal tape material is characterized in that an area fraction $A_1$ of a preferentially <100> oriented region in which crystal axes <100> of a unit lattice of the face centered cubic structure are within an orientation difference of 15° relative to a thickness direction of the metal tape material and further within an orientation difference of 15° relative to a first in-plane direction of the metal tape material is 60% or greater and not greater than 100%, and, where an area fraction of a preferentially <212> oriented region in which crystal axes <212> of the unit lattice of the face centered cubic structure are within an orientation difference of 15° relative to the thickness direction of the metal tape material and further within an orientation difference of 15° relative to the first in-plane direction of the metal tape material is defined as $A_2$, the total of the area fraction of the preferentially <212> oriented region and the area fraction of the preferentially <100> oriented region, $A_1+A_2$, is greater than 70% and not greater than 100%.

(2) A metal tape material as set out in (1), wherein the first direction is the longitudinal direction of the metal tape material.

(3) A metal tape material as set out in (1) or (2), characterized in that the area fraction $A_1$ is 65% or greater and not greater than 99.8%, the area fraction $A_2$ is 0.2% or greater and not greater than 12%, and the total $A_1+A_2$ is greater than 70% and not greater than 100%.

(4) A metal tape material as set out in any of (1) to (3), characterized in that crystal grains constituting the preferentially <100> oriented region form at least part of each of a top surface and an under surface of the metal tape material, the crystal grain size of the crystal grains in an in-plane direction of the metal tape material is 400 μm or greater, and the crystal grains have a structure in which the crystal grains constituting the preferentially <212> oriented region are dispersed internally.

(5) A metal tape material as set out in any of (1) to (4), characterized in that the metal is copper of a purity of 99.9% or greater.

(6) A metal tape material as set out in any of (1) to (5), characterized in that the surface is coated with a metal of a melting point of 250° C. or less.

(7) An interconnector for solar module current collection characterized in being a metal tape material as set out in any of (1) to (6) whose width is 1 mm or greater and not greater than 5 mm and thickness is greater than 50 μm and not greater than 300 μm.

Compared to a metal tape material formed in the conventional configuration using the same substance, the metal tape material according to the present invention enables marked reduction of Young's modulus, and particularly Young's modulus and yield stress in the longitudinal direction. It is therefore possible to lower the stress acting on a semiconductor substrate connected to the metal tape material of the present invention by solder, electrically conductive bonding agent, or the like, and possible to inhibit warping of the semiconductor substrate, as well as breaking of connection interfaces and the semiconductor substrate. Further, when the interconnector for current collection of a solar module or the like is formed using the metal tape material according to the present invention, damage of the solar cells by thermal stress can be reduced. In addition, break elongation is increased to enable mitigation of the danger of the metal wire breaking because of mechanical stress produced when tension is applied during packaging or because of thermal stress caused by temperature change after cooling following bonding or during use.

MODES FOR CARRYING OUT THE INVENTION

The metal tape material according to the present invention is connected to the surface of a semiconductor of a solar cell, semiconductor chip or the like and used to collect current and transmit electrical signals. The metal tape material according to the present invention is explained in detail in the following. As used in the following detailed explanation, the term "linear mounting" means a mode of installation in which the metal tape (long conductor) is connected to the surface of a semiconductor surface in a linear manner, i.e., to be connected in two-dimensional line contact, for the purpose of collecting current or forming an electric signal circuit, and the term "metal tape surface" means the surface where the semiconductor surface and the metal tape are bonded. Further, the term "L direction" means the longitudinal direction of the metal tape conductor used in the linear mounting, the term "D direction" means the direction normal to the semiconductor surface, and the term "W direction" means the direction perpendicular to both the L direction and the D direction. In the tape surface, the L direction side is generally a longer broadside than the W direction side.

Figure 1:
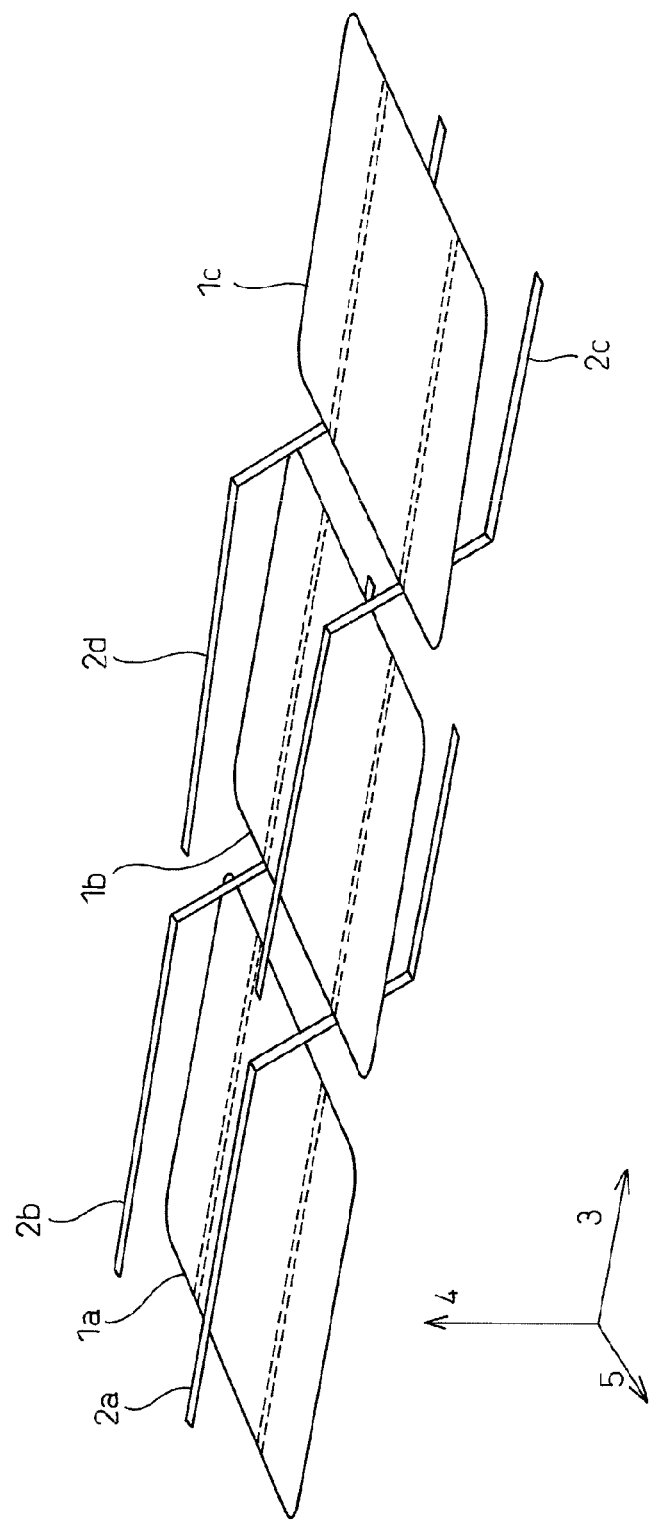
FIG. 1 is diagram schematically illustrating a solar module linearly mounted with an interconnector for current collection that is an embodiment according to the present invention.

FIG. 1 is diagram schematically illustrating part of a crystal-type solar module linearly mounted with an interconnector for current collection that is an embodiment according to the present invention.

As shown in FIG. 1, part of a solar module comprises solar cells 1a, 1b and 1c and interconnectors for current collection 2a, 2b, 2c and 2d, which are metal tapes. The solar cells 1a, 1b and 1c, and the interconnectors for current collection 2a, 2b, 2c and 2d are mechanically and electrically joined by solder or electrically conductive bonding agent to be respectively linearly mounted. More specifically, the interconnectors for current collection 2a and 2b are linearly mounted on the front surface of the solar cell 1a and the rear surface of the solar cell 1b located adjacent in the L direction 3 of the solar module 1a. Here, the front surface means the surface facing forward in the D direction 4, and the rear surface means the surface facing backward in the D direction 4. The interconnectors 2c and 2d are linearly mounted on the front surface of the solar cell 1b and the rear surface of the solar cell 1c. Thus the solar cells 1a, 1b and 1c are connected by the interconnectors for current collection 2a, 2b, 2c and 2d so as to be electrically connected in series. The interconnectors for current collection 2a and 2b are deployed to be suitably spaced apart in the W direction 5. Similarly, the interconnectors for current collection 2c and 2d are deployed to be suitably spaced apart in the W direction 5.

Figure 2:
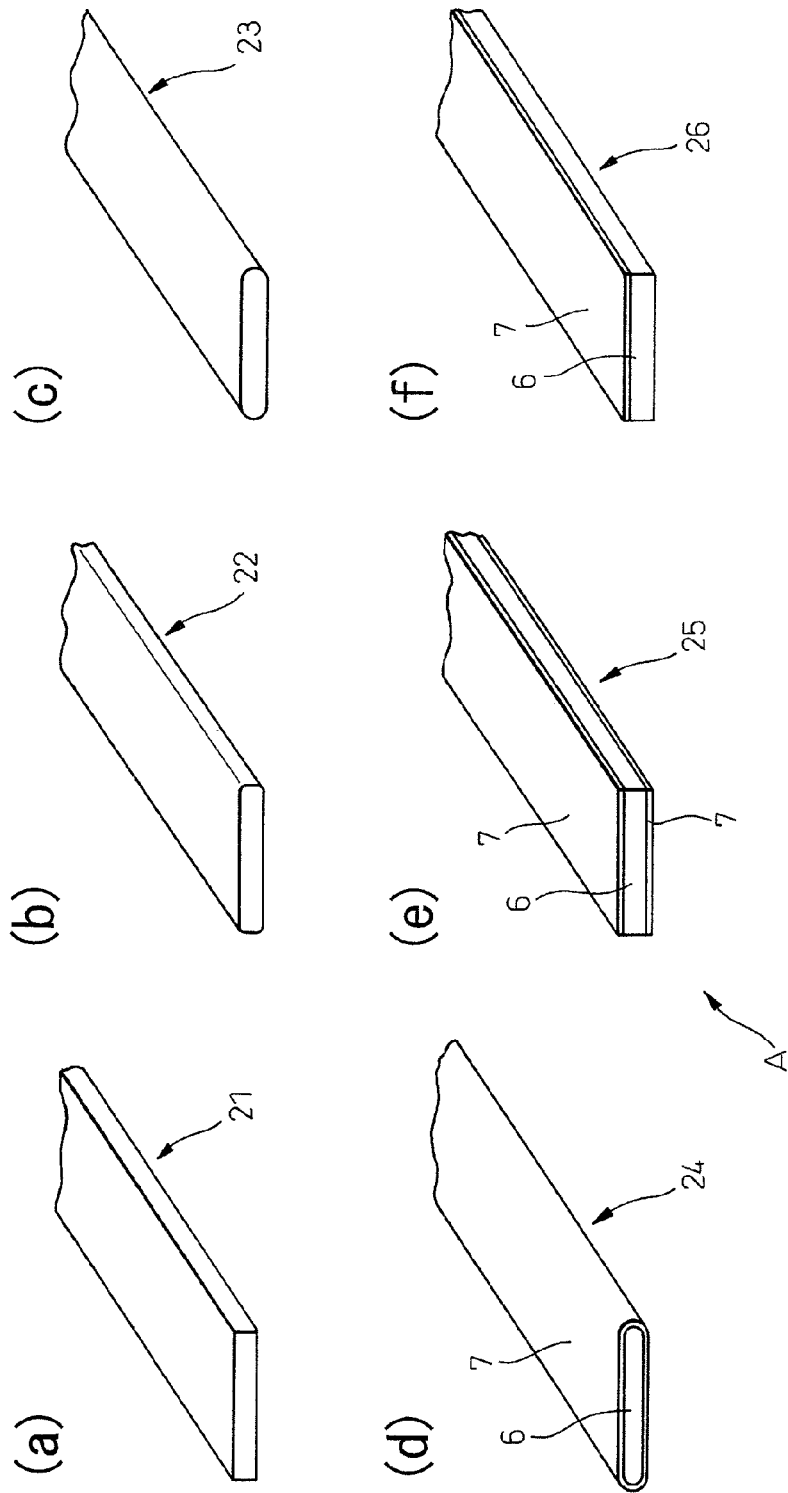
FIG. 2 is a set of diagrams schematically illustrating embodiments of metal tape materials according to the present invention.

FIG. 2 is a set of diagrams schematically illustrating embodiments of metal tape materials 21 to 26 according to the present invention, consisting of tape-shaped metal or tape-shaped conductors. Parts of the top surfaces and under surfaces of the metal tape materials 21 to 26 are bonded to the solar cells 1. Further, the metal tape materials 21 to 26 pass current in the direction indicated by arrow A or the direction opposite from arrow A. The cross-section of the metal tape orthogonal to the current flow direction, i.e., the cross-sectional opposed to arrow A, can be given various shapes. In the metal tape material 21 shown in FIG. 2(a), the cross-section opposed to arrow A is of laterally long rectangular shape. Further, in the metal tape material 22 shown in FIG. 2(b), the cross-section opposed to arrow A differs from that of the metal tape material 21 shown in FIG. 2(a) in that the four corners are not right angular but rounded. Further, in the metal tape material 23 shown in FIG. 2(c), the cross-section opposed to arrow A has curved vertical sides that bulge the whole outward.

The metal tape material can be composed of a metal core 6 and a conductive bonding agent 7 coating the metal core 6. In the metal tape material 24 shown in FIG. 2(d), all of the top surface, under surface and side surfaces are coated with the bonding agent 7. In the metal tape material 25 shown in FIG. 2(e), the top surface and under surface of the metal core 6 are coated with the bonding agent 7. In addition, in the metal tape material 26 shown in FIG. 2(f), only the top surface of the metal core 6 is coated with the bonding agent 7. The bonding agent 7 is for bonding the metal tape materials 24 to 26 to the solar cells when they are used as interconnectors for current collection. To be specific, the bonding agent 7 is solder, thermosetting conductive bonding agent, or the like.

However, the metal tape according the present invention need not necessarily be coated with solder or conductive resin. In the case of linear mounting with solder tape, paste or conductive bonding agent, the metal tape according to the present invention is preferably a bare wire like the metal tape materials 21 to 23. A bare wire like the metal tape materials 21 to 23 is also called a bare metal tape. The surface of the bare metal tape is best coated with a rust inhibitor such as benzotriazole. In the case where the bare metal tape is used in its primary application as a current-collection interconnector of a solar module, or other such material for semiconductor linear mounting, the bare metal tape is best coated with solder plating or a conductive bonding agent. In this case, the bonding process and equipment can be simplified because the metal tape does not require alignment with a solder ribbon and does not require supply of bonding material from the outside. Further, a material coated with solder plating or a conductive bonding agent is also advantageous in the point of outstanding shelf life because it is excellent in corrosion resistance.

In the present invention, the melting point of the coating metal is preferably low. This is because use of a low-melting-point metal as the coating metal reduces thermal distortion occurring during linear mounting. Specifically, the melting point of the coated metal is desirably 250° C. or less. The coating metal need not be single phase. It suffices if the coating metal is molten at 250° C. or less during linear mounting, namely, during reflow. In use as a current-collection interconnector of a crystalline silicon solar module, the melting point of the coating metal is desirably 180° C. or greater. This is because the coating metal must not remelt at the polymerization temperature of the ethylene-vinyl acetate or the like used to seal the solar cells.

Coating metals satisfying the aforesaid conditions are lead-based solder, tin-based solder and so on. Taking environmental issues into consideration, it is most desirable in the present invention to use a tin-based solder as the material coating the conductor. The melting point of tin is 232° C. However, by adding silver to tin, the melting point can be lowered to 221° C. In this case, the silver constituent is 3.5 mass %. However, when other additive elements, bondability, joint strength and other factors are taken into account, the silver constituent can be in the range of 1 to 4 mass %. By adding copper in addition to silver, the melting point of the coating metal can be lowered to 217° C. In this three-element eutectic composition, the silver constituent is 3.8 mass %, the copper-silver constituent is 0.5 mass %, and tin can be another constituent. However, when other additive elements, bondability, and joint strength are taken into account, the copper-silver constituent can be made 0.4 to 1.0 mass %. In addition, a fourth element and a fifth element can be added as necessary.

The conductive resin (bonding agent) used for linear mounting is, for example, a resin containing a metal filler. As the metal filler is used a metal powder relatively high in corrosion resistance such as gold, silver, copper, platinum or palladium, together with a carbon powder such as carbon black or graphite grains. An epoxy, acrylic, phenolic or other such resin is used as the resin material. As the conductive resin used for linear mounting can be utilized either a thermosetting resin or an ultraviolet curable resin. However, the curing temperature of the conductive resin is desirably 250° C. or less. Further, after curing, the conductive resin for a solar module must not soften at a temperature of 180° C. or less. In addition, the conductive resin for a solar module must not be degraded by ultraviolet rays.

The electrical conductivity of the metal tape used in linear mounting is preferably high. This is because when the electrical conductivity of the metal tape is low (i.e., when the electrical resistance is high), the cross-sectional area of the metal tape must be increased, so that strong thermal strain acts on the semiconductor after soldering. Therefore, the material of the metal tape used for linear mounting is preferably a metal high in electrical conductivity, and specifically is preferably a face centered cubic metal such as copper, silver, aluminum or gold. Among these face centered cubic metals, copper is high in electrical conductivity, relatively low in coefficient of thermal expansion, and procurable at a low price. Copper is therefore the most preferable material among these face centered cubic metals. From the viewpoint of electrical conductivity, the metal tape material is desirably pure copper. When the metal tape material is to be used as an industrial material, the metal tape material is preferably a high-purity copper of 99.9% or higher purity such as tough pitch copper or oxygen-free copper.

In order to mitigate the thermal strain caused by the difference in thermal expansion between the semiconductor and metal tape at the time of linear mounting with solder, conductive resin or the like, it is extremely effective to lower the Young's modulus and yield stress of the metal tape in the longitudinal direction, i.e., the L direction. Particularly in an application where connections are made at a bonding temperature of 180° C. to 250° C., it is important to lower the stress value when the longitudinal strain is 0.2%. For example, the index used to represent yield property when evaluating a solar module interconnector for current collection is the metal tape 0.2% proof stress or the like. In the cooling process after the solder has melted and solidified or after the conductive bonding agent has set, thermal distortion occurs owing to the difference in thermal contraction between the semiconductor and the metal tape. In proportion as the Young's modulus and yield stress in the longitudinal direction of the metal tape are smaller, the stress acting on the semiconductor becomes smaller, the degree of warping decreases, and the frequency of cracking diminishes. In addition, the break elongation increases so that at the time of linear mounting it is possible to lower the risk of the metal wire being broken by, for example, tensile stress occurring when tension is applied, tensile stress occurring during cooling of the mated regions after bonding, and stress caused by temperature change during use. Large break elongation is therefore one important mechanical property of a metal tape material for semiconductor linear mounting, especially a solar module interconnector for current collection.

An ultraviolet curable bonding agent is generally low in curing temperature and small in thermal strain at the time of linear mounting. An ultraviolet curable bonding agent is therefore preferably used as the bonding agent for linear mounting on a semiconductor. However, even in the case of using a resin such as an ultraviolet curable bonding agent, the Young's modulus and yield stress in the longitudinal direction of the metal tape material used are desirably low and the break elongation is desirably large. This is to reduce the thermal strain that occurs repeatedly owing to changes in the environment, such as variation in external temperature during use, and lower the risk of the metal wire being broken by the thermal strain that arises.

In the light of foregoing circumstances, the inventors controlled the structure of a metal tape material as set out below to suppress Young's modulus, yield stress and 0.2% proof stress, and to increase break elongation, thereby inventing a metal tape material that can be suitably used for connection to the surface of a solar cell, semiconductor chip or other semiconductor.

Specifically, the metal tape material of the present invention is given a texture wherein the area fraction $A_1$ of a preferentially <100> oriented region in which the fundamental crystal axes <100> of a unit lattice of a face centered cubic structure are within an orientation difference of 15° relative to the thickness direction of the metal tape material and further within an orientation difference of 15° relative to a first in-plane direction of the metal tape material is 60% or greater and not greater than 100%, and, where the area fraction of a preferentially <212> oriented region in which the crystal axes <212> of the unit lattice of the face centered cubic structure are within an orientation difference of 15° relative to the thickness direction of the metal tape material and further within an orientation difference of 15° relative to the first in-plane direction of the metal tape material is defined as $A_2$, the total of the area fraction of the preferentially <212> oriented region and the area fraction of the preferentially <100> oriented region, $A_1+A_2$, is greater than 70% and not greater than 100%. By adopting such texture as the texture of the metal tape material, the 0.2% proof stress of the metal tape material can be reduced, and particularly the 0.2% proof stress in the longitudinal direction can be reduced. As a result, it is possible to markedly lower the stress and strain acting in the longitudinal direction of the semiconductor owing to the difference in coefficient of thermal expansion (thermal contraction rate) during linear mounting.

A texture can be suitably established in which the area fraction $A_1$ of the preferentially <100> oriented region is 65% or greater and not greater than 99.8%, the area fraction $A_2$ of the preferentially <212> oriented region is 0.2% or greater and not greater than 12%, and the total of the area fraction of the preferentially <212> oriented region and the area fraction of the preferentially <100> oriented region, $A_1+A_2$, is greater than 70% and not greater than 100%. By this, the 0.2% proof stress of the metal tape material can be additionally reduced and the break elongation improved.

The metal tape material having such mechanical properties best has a configuration wherein the crystal grains constituting the preferentially <100> oriented region form at least part of each of the top surface and the under surface of the metal tape material. That is, in the metal tape material having such mechanical properties, all of the crystal grains constituting the preferentially <100> oriented region pass from one metal tape surface of the metal tape material through to the other metal tape surface. Further, in a metal tape material coated with solder or a conductive bonding agent, the metal core coated with the coating material has a structure wherein the crystal structure is a face centered cubic structure and forms at least part of each of the top surface and the under surface of the metal core. In other words, the metal core has a structure wherein the crystal grains constituting the preferentially <100> oriented region pass from the top surface through to the under surface of the metal core. Also preferably, the size of the crystal grains oriented in <100> direction is 400 μm or greater. Further, the preferentially <100> oriented region should best be formed internally with dispersed crystal grains differing in crystal orientation from the <212> crystal axis dominated by the preferentially <212> oriented region.

When used in the present specification, the term "crystal grain size" means the size of a single crystal observed at a metal tape surface or other prescribed surface and is expressed as the equivalent circular diameter of the crystal surface observed at the prescribed surface. It should be noted that even in the case where the crystal surfaces observed at the prescribed surface include a phase inside the crystal grains having an orientation different from the crystal concerned, the observed crystal is deemed to be a single crystal when no breakpoint is present, except when the periphery of the crystal surface is at the top surface or under surface of the tape core. Further, when used in the present specification, the term "dispersed" means that crystal grains or phases are distributed at various locations.

The realization of such mechanical properties enables marked reduction of semiconductor L-direction stress and strain owing to difference in coefficient of thermal expansion (thermal contraction rate) during linear mounting. As a result, it is possible to minimize problems owing to breakage of the metal tape material and detachment of joints between the metal tape material and the semiconductor during linear mounting and during use.

When used in the present specification, the term "area fraction of a preferentially oriented region" means the area fraction of the crystal grains in the orientation range defined above that are present in a cross-section formed by cutting the metal tape material at an arbitrary section (area ratio relative to the visual field area of crystal grain observation defined in the foregoing). The term "orientation difference" means the angle of rotation formed between a given crystal axis and a prescribed direction. In addition, crystal axis <100> and crystal axis <212> respectively mean direction normal to lattice plane (100) and (212).

It should be noted that since the present invention is a metal tape material used, for example, to package semiconductors, ordinarily the observation field surface is desirably the tape broadside, i.e., the metal tape surface. This is because defining the metal tape surface as the observation field surface enables evaluation of a larger area than in the case of defining another surface as the observation field surface. In addition, when fabricating a polished or other specimen, and when measuring orientation by EBSD (Electron Back-scattering Diffraction) or the like, angle error can be reduced. Nevertheless, another surface can also be defined as the observation field surface. In this case, in order to acquire typical data characteristic of the structure, it is necessary to analyze a sufficiently large area, and to minimize angle error at the time of fabricating the specimen and at the time orientation measurement.

First, the reason for defining the index of orientation difference as 15° will be explained. The reason for defining the index of orientation difference as 15° is that grain boundary strongly affecting mechanical properties like yield stress expressed as 0.2% proof stress or the like, strength and break elongation, is generally defined as crystal grain boundary having an orientation difference of an angle of rotation of 15° degrees or greater. In a cubic crystal containing a face centered cubic metal, the minimum orientation difference between the crystal axes <001> and the crystal axes <111> is 54.4°. Further, the minimum orientation difference between the crystal axes <100> and the crystal axes <212> is 48.1°. Further, the minimum orientation difference between the crystal axes <001> and the crystal axes <211> is 35.2°. In addition, the minimum orientation difference between the crystal axes <211> and the crystal axes <212> is 17.4°. Defining the index of orientation difference as 15° distinguishes the texture whose principal orientations are these typical crystal axis orientations.

Next, it will be explained why it is specified with respect to the fundamental crystal axes <100> of the unit lattice of the face centered cubic structure that the area fraction $A_1$ of the preferentially <100> oriented region is 60% or greater and preferably 65% or greater. The reason for so specifying is mainly to lower the yield stress of the metal tape. A face centered cubic metal, particularly the copper, silver, aluminum and gold that are used as solar module current-collection interconnectors and other semiconductor packaging materials, can be more readily formed with <100> texture than with other orientations. The crystal grains can therefore be coarsened by growing and merging the <100> texture. By enlarging the area fraction of the preferentially <100> oriented region, it is possible to reduce the grain boundary constraint with respect to the L-direction tensile stress caused by the difference in thermal contraction occurring at the time of linear mounting. Further, in the course of the propagation of dislocations produced by tensile stress, the dislocations are less likely to be impeded and constrained by the grain boundaries. As a result, the yield stress of the metal tape diminishes, so that the stress acting in the L-direction of the semiconductor substrate can be reduced.

Of particular note is that when the metal tape material is used as a solar module current-collection interconnector, the 0.2% proof stress can be markedly reduced in the case where the grain size of the <100> crystal grains that forms the preferentially <100> direction oriented region in the tape plane is 400 μm or greater. Moreover, in the case where the grain size of the <100> crystal grains that form the preferentially <100> direction oriented region in the tape plane is 800 μm or greater, the 0.2% proof stress can be markedly reduced.

A face centered cubic metal can also form a <111> or <211> oriented aggregate structure. However, the Schmid factor becomes larger in the case of forming a <111> oriented texture or a <211> oriented texture than when forming a <100> oriented texture. From the viewpoint of reducing yield stress, therefore, in the direction normal to the metal tape surface and in the plane of the metal tape, larger preferentially <100> direction oriented regions along the respective <100> axes are desirable. Further, to the contrary, regions occupied by crystal grains having other orientations are desirably smaller.

Next, it will be explained why the total of the area fraction of the preferentially <100> oriented region and the area fraction of the preferentially <212> oriented region, $A_2+A_1$, is specified to be greater than 70%. In the case of a face centered cubic metal, the orientation of the crystal axes <212> is the tape surface normal of the twin of the texture having the preferentially <100> oriented region and corresponds to the main tape plane. The twin boundary has less effect on yield stress than the grain boundary. In the present invention, therefore, with consideration to the area fraction $A_2$ of the preferentially <212> oriented region of the crystal axes <212> of the unit lattice of the face centered cubic structure, the total of the area fraction of the preferentially <100> oriented region and the area fraction of the preferentially <212> oriented region, $A_1+A_2$, is specified to be greater than 70%. Preferably, the area fraction $A_2$ of the preferentially <212> oriented region is an area fraction of 0.2% or greater and not greater than 12%, and may be present as dispersed in the preferentially <100> oriented region. Owing to this, break elongation can be increased while keeping 0.2% proof stress in the longitudinal direction of the metal tape low. By this there is exhibited an effect of reducing the likelihood of metal tape breakage when the metal tape is connected to a relatively thick semiconductor substrate.

In the case where the tape plane has present therein a phase that is enclosed within a single crystal grain constituting the preferentially <100> oriented region and is dispersed to be present in another orientation, the size of its crystal grains is specified as a size including dispersed phases other than the <100> orientation. The same also applies in the case where the boundary thereof is a high-angle grain boundary. In the tape plane, when the size of the <212> phase dispersed in the preferentially <100> oriented region is 100 μm or less in equivalent circular diameter, desirably 30 μm or less, break elongation is particularly large.

It suffices if the metal tape forms a texture having two crystal axes <100> as principal orientations. The primary orientation of the crystal axis <100> in the surface of the metal tape need not necessarily coincide with the L direction. When the center axis of the one crystal axis <100> in the metal tape plane, i.e., the primary orientation of the crystal axes <100> of the texture, makes an angle of other than 0° with respect to the L direction, it is preferably turned to be the center axis of the W direction. Defining the principal axis of the crystal axes <100> of the texture in this way makes it possible to reduce the Schmid factor and further lower the proof stress. It is therefore particularly preferable when the bonding temperature of the metal tape and the semiconductor substrate is high and the strain becomes large.

However, in the case where the metal tape is mounted with a brazing metal like solder, if the direction of one crystal axis <100> is aligned with the L direction, the proof stress in the longitudinal direction becomes larger than when the direction of one crystal axis <100> is not aligned with the L direction. But Young's modulus decreases in this case, so no significant disadvantage arises. In addition, in the case of bonding at a low temperature, alignment of the direction of one crystal axis <100> with the L direction may sometimes rather offer an advantage. It should be noted that a metal tape with two crystal axes of the metal tape surface coincident with the L direction and the W direction can be produced by suitable rolling and heat treatment.

The results explained in the foregoing can in principle be obtained not only with copper but also with other face centered cubic metals having similar slip systems. Aluminum is higher in resistivity than copper but has the merit of being low in elastic modulus and yield stress. Further, silver is more expensive than copper but has the merit of being low in all of elastic modulus, yield stress, and electrical resistance.

The metal tape material of the present invention can be used to good effect as a solar module current-collection interconnector for collecting electromotive force generated by solar cells, interconnecting the solar cells, and transmitting electric power. As shown in FIG. 1, the solar module current-collection interconnector is linearly mounted on the solar module surfaces. In the present invention, when the metal tape material is applied as a solar module current-collection interconnector according to the present invention, its cross-sectional shape and size are appropriately determined in accordance with the application. Further, depending on the application, the solar module current-collection interconnector can be made by coating the metal tape with another metal. The thickness of the coating metal is appropriately determined for the application. Particularly when used as a solar module current-collection interconnector in a crystalline silicon solar module, the width of the core of the metal tape is 1 mm or greater and 5 mm or less, and the thickness is preferably in the range of greater than 50 μm and not greater than 300 μm.

In a solar cell array series-connected through solar module current-collection interconnectors, the collected electric current is generally around 2 to 4 A. Therefore, when, for example, two solar module current-collection interconnectors are connected per solar cell, each solar module current-collection interconnector must carry a maximum current of 2 A. Further, taking into account heat generation owing to electrical resistance, even in the case of using copper, silver or other material relatively low in electrical resistance, the current carrying capacity of the solar module current-collection interconnector must be 8 A/mm$^2$ or less. The upper limit of the W-direction width of the solar module current-collection interconnector is 5 mm because expanding the width of the solar module current-collection interconnector in the W direction decreases the light-receiving area. Therefore, in the case of using a solar module current-collection interconnector, the metal tape thickness must be greater than 50 μm. In addition, when the metal tape thickness is 50 μm or less, the strength of the metal tape declines and the break elongation also decreases. Therefore, in the case of using a solar module current-collection interconnector, the danger of breakage during mounting and during use increases. On the other hand, taking the thickness of the crystal-type solar modules currently in use (about 200 μm) into account, it is undesirable for the thickness of the metal tape to exceed 300 μm. When the thickness of the metal tape exceeds 300 μm, the longitudinal direction cross-sectional moment increases to increase cell warping during connection. Therefore, the danger of the joints between the metal tape and the solar cells, and of the solar cell being broken increases. So the W-direction width of the solar module current-collection interconnector must be made at least 1 mm.

In light of the foregoing, the cross-sectional shape of the crystal-type solar module interconnector that is the classical application of the present invention should preferably be 1 mm or greater to 5 mm or less in width, and greater than 50 μm, preferably greater than 100 μm, and not greater than 300

μm in thickness. Further, the crystal grains constituting the preferentially <100> oriented region preferably have a structure which passes through from the upper side to the lower side of the cross-sectional shape so as to constitute at least part of both the upper side and the lower side of the cross-sectional shape. In addition, the crystal grain size of the <100> crystal grains is preferably 400 μm or greater at both the upper side and the lower side of the cross-sectional shape. Here, the crystal structure of the metal tape material coated with solder or conductive bonding agent is of face centered cubic structure, which has a structure that constitutes at least part of both the upper surface and the lower surface of the metal core tape surface. In other words, the metal core has a structure wherein the crystal grains constituting the preferentially <100> oriented region pass from the upper surface through to the lower surface of the metal core.

The method of forming the metal tape having the texture according to the present invention is not specified as any concrete method. However, in order to form, for example, a metal tape having an aggregate structure in which a crystal axis <100> is oriented in each of the thickness direction, longitudinal direction and width direction of the metal tape, it is possible to utilize rolling and recrystallization of the metal tape starting material. A face centered cubic metal can be given a texture whose crystal axes <100> are oriented in the processing direction by appropriately selecting the processing and recrystallization conditions. However, unlike with a very thin metal foil, in order to form an aggregate structure in the metal tape of the present invention, processing must be performed under various conditions.

It is known that rolling and drawing give a face centered cubic metal a recrystallized structure in which the orientation of a crystal axis <100> is aligned in the longitudinal direction. As the method of forming the metal tape having the texture according to the present invention, it is preferable to carry out the production method of cold-rolling a metal sheet at a set rolling reduction, cold rolling to a prescribed thickness, and slitting to a prescribed width. This is because when growth of the preferentially <100> oriented region is compared to growth of the preferentially <212> oriented region, the latter is superior. Further, the processed structure obtained by cold-rolling the metal sheet to elongate parallel to the rolled surface and sheet-like is particularly convenient for growing (100) recrystallized grains in the directions perpendicular to the sheet thickness direction. On the other hand, when drawing of metal wire is the main process, this growth of the recrystallized texture is impeded.

The metal tape having the texture according to the present invention can be formed by carrying out rolling at a high cold working rate and thorough recrystallization heat treatment. However, when the area fraction of the preferentially <100> oriented region exceeds 99.8%, for instance, to become excessively large, the break elongation declines. Thus it can be seen that it is not desirable to increase the cold working rate but desirable to adopt the optimum working rate in accordance with the heat history and working history of the final cold working.

Differently from in production of a metal foil of 50 μm or less, if an adequate cold working rate cannot be attained, shear strain is imparted to the metal tape in the thickness direction of the metal tape by differential speed rolling or the like. Next, recrystallization heat treatment is conducted, cold working is further performed at a prescribed reduction ratio or greater, and finally recrystallization heat treatment is conducted. By such processing, a relatively small cold-rolling reduction ratio is sufficient. The final recrystallization heat treatment temperature depends on the metal purity. In the case of processing industrially utilized high-purity copper, aluminum or silver, the final recrystallization heat treatment temperature is 180° C. or greater.

In a metal tape that is one embodiment according to the present invention, a crystal axis <100> is oriented in the thickness direction and the other two crystal axes <100> have aggregate structures out of line with the longitudinal direction and the width direction. The metal tape having this texture is especially excellent as the material of a current-collection interconnector for a thin solar module. This is because in such a metal tape the Schmid factor is small and the proof stress low in the longitudinal direction. Such a metal tape can be produced by cutting the metal sheet rolled to the final thickness at an angle offset from the rolling direction. Yield stress is minimum when processing is done to shift the Schmid factor 22.5° from the rolling direction. However, yield stress can be reduced about 5% even in the case of a 5° shift.

When a metal tape is produced for use in a solder-coated solar module current-collection interconnector, it is preferable from the aspect of corrosion resistance for the solder to be applied over the entire surface of the metal tape. The metal tape is therefore preferably slit before the metal tape is solder plated.

Further, a hot-dip solder plating process can serve as the recrystallization heat-treatment process. However, it is undesirable for the processing temperature of the hot-dip solder plating step to be high and/or for the processing time to be too long. This is because a brittle intermetallic compound sometimes forms more than required between the solder and the metal tape (core). Moreover, after conducting bright annealing, continuous hot-dip solder plating can be conducted to enable oxide removal, recrystallization treatment and solder plating of the metal tape to be performed simultaneously. In this case, excessive growth of the intermetallic compound is preferably avoided by lowering the infusion time of the hot-dip solder plating. Further, in order to remove oxide film prior to these processes, the bright annealing line speed is preferably increased and the bright annealing temperature is preferably increased. In addition, in order to increase the bright annealing line speed and simultaneously achieve softening by recrystallization and removal of surface oxides, the bright annealing furnace temperature is preferably 550° C. or greater. Since the processes following the solder plating process destroy the <100> texture and increase proof stress by work hardening the metal, intense working should not be applied. However, light working such as skin-pass rolling can be incorporated after the solder plating process for optimizing surface property.

EXAMPLES

Although the present invention is explained in detail based on examples in the following, these are for illustrating the present invention and the present invention is in no way limited by the examples. Copper metal tape materials were fabricated by a number of different methods set out below. In addition, the fabricated metal tape materials were used as solar module current-collection interconnectors and tests simulating their implementation were conducted. Further, in order to confirm the mechanical properties and structure characteristics of the material of the present invention, conventional solar module current-collection interconnectors were also fabricated and tested.

Example 1

In this example, metal tape materials were fabricated by the following four processing methods A to D. The fabricated metal tape materials were metal tape (flat wire) materials of 99.99% pure oxygen-free copper of 160 μm thickness×2 mm width. Note that the metal tape materials fabricated by the processing methods C and D were all fabricated as comparative examples.

In processing method A, a metal tape material was fabricated by rolling a 10 mm thick thermo-ductile copper sheet to 2 mm with a differential. speed rolling mill at a 4% differential between the upper and lower rollers, and next performing 300° C.×30 min intermediate heat treatment within an Ar gas stream in a batch furnace; and next rolling to 160 μm in a cold-rolling mill, followed by slitting into 2-mm wide strips. In processing method B, a metal tape material was fabricated similarly to in processing method A up to before the slitting, but the final slitting differed in the point that production was carried out by slitting at an inclination of 5° with respect to the rolling direction.

In processing method C, a metal tape material was fabricated by swaging a 20-mm-diameter round bar of the same oxygen-free copper as used in the processing methods A and B to a diameter of 5 mm; thereafter drawing to a diameter of 2 mm and finally rolling to 2 mm width and 160 μm thickness. In processing method D, a metal tape material was fabricated by rolling a 10 mm thick thermo-ductile copper sheet of the same kind as used in processing method A to 2 mm with an ordinary rolling mill and next performing 300° C.×30 min intermediate heat treatment within an Ar gas stream in a batch furnace; and next rolling to 160 μm in a cold-rolling mill, followed by slitting into 2-mm wide strips.

Using a tubular electric furnace, the metal tape materials produced by the aforesaid 4 types of processing methods were continuously heat-treated in an Ar gas stream at a flow velocity of 10 m/min. The heat treatment was conducted under a number of heat-treatment temperature conditions. Then followed passage through an Sn—1.2 mass % Ag—0.5 mass % Cu alloy hot-dip solder bath. In addition, skin-pass rolling was performed to coat the periphery of the metal tape material with solder to a thickness of 20 μm. Almost no change in metal tape material thickness by this processing was observed.

When the structure of a metal tape material was evaluated, the metal tape material was analyzed using the EBSD method (Electron Back-scattering Diffraction method). Unlike the X-ray diffraction method, the EBSD method enables analysis of three-dimensional crystal orientation from a single surface. The crystal orientation analysis of the metal tape material was performed at a widthwise middle region of the metal tape material which had been abraded to expose the copper and polished to a final finish using colloidal silica. Further, the crystal orientation analysis was performed by analysis of an 800 μm×1600 μm region of the metal tape material at 1 to 4 μm intervals. The ratio (%) of the points where crystal axes <100> had orientations whose angles were within ±15 relative to the thickness direction and the rolling direction of the metal tape material to all measured points was defined as the area fraction $A_1$ of the measured ratio of the preferentially <100> oriented region. Similarly, the ratio (%) of the points where crystal axes <212> had orientations whose angles were within ±15° relative to the thickness direction and the rolling direction of the metal tape material to all measured points was each defined as the area fraction $A_2$ of the measured ratio of the preferentially <212> oriented region. The adequately large measured region and adequately fine measurement interval of the analysis make it possible to calculate the area fraction $A_1$ of the preferentially <100> oriented region and the area fraction $A_2$ of the preferentially <212> oriented region from the measured values. The 0.2% proof stress of the metal tape material was measured by tensile testing. Since the thickness and coating method of the solder layer were identical among all of the metal tape materials, difference in measured 0.2% proof stress was attributable to difference in the properties of the metal tape (core) material.

The solar module wafer of polycrystal silicon used for implementation and evaluation in a solar module was 156 mm square and 180 μm thick, and two parallel electrodes were provided in parallel with one side of the wafer to be symmetrical at an interval of 80 mm from the wafer center line. The electrodes were formed by baking on silver paste and had a thickness of about 10 μm. Linear mounting was carried out by welding (reflow) metal tape materials (interconnectors for current collection) to the wafer along the electrodes. Reflow was performed in an argon heat-treatment furnace with a load of 1 kPa applied onto the interconnectors for current collection disposed on the wafer. The reflow temperature was 250° C.

The linear mounting was followed by spontaneous cooling to room temperature (25° C.), whereafter the load was removed. As a result, the wafer was observed to warp in the linear mounting L direction inward on the metal tape material side. This was caused by the difference in amount of thermal contraction that occurred during the post-reflow spontaneous cooling to room temperature as a result of the metal tape material having a larger coefficient of thermal expansion than the polycrystal silicon solar module wafer. The degree of warping differed considerably depending on the metal tape material. It should be noted that the degree of warping was evaluated using the maximum height difference of the wafer as the warp amount.

In Table 1 below, the area fraction $A_1$ of the preferentially <100> oriented region, the area fraction $A_2$ of the preferentially <212> oriented region, the sum thereof, $A_1+A_2$, the 0.2% proof stress, and the assessed warp amount are shown for the individual metal tape materials. Although the area fraction $A_1$ of the preferentially <100> oriented region and the area fraction $A_2$ of the preferentially <212> oriented region were both calculated for two directions, i.e., the thickness direction and the rolling direction of the metal tape material, only the smaller of the values is shown in Table 1. It should be noted that in most cases the degree of integration of the crystal axis <100> and crystal axis <212> of the aggregate structure was greater in the rolling direction than in the thickness direction of the metal tape material. The area fractions calculated in this manner substantially coincided with the area fractions of the preferentially oriented regions in which the crystal axes of the individual unit lattices of the copper were within an orientation difference of 15° relative to the tape thickness direction and within an orientation difference of 15° relative to one in-plane direction of the tape material.

Further, ones with warp of 2.0 mm or less did not sustain breakage of the joints between the metal tape material and the solar module wafer or of the solar module wafer even when the warped region was forcibly flattened again. Based on this, ones with a warp of 2.0 mm or less were evaluated to be in a range posing no problem as a metal tape materials.

TABLE 1

| Specimen no. | Processing method | Continuous heat-treatment temp. (° C.) | 0.2% proof stress (MPa) | Area fraction A₁ of preferentially <100> oriented region (%) | Area fraction A₂ of preferentially <212> oriented region (%) | A₁ + A₂ (%) | Warp (mm) | Remark |
|---|---|---|---|---|---|---|---|---|
| 1 | A | 280 | 350 | 4 | 53 | 57 | 4.3 | Comparative |
| 2 | A | 300 | 99 | 15 | 54 | 69 | 2.3 | Comparative |
| 3 | A | 320 | 87 | 60 | 11 | 71 | 2.0 | Invention |
| 4 | A | 340 | 80 | 81 | 7 | 88 | 1.0 | Invention |
| 5 | A | 360 | 75 | 92 | 5 | 97 | 0.7 | Invention |
| 6 | A | 380 | 74 | 93 | 2 | 95 | 0.7 | Invention |
| 7 | A | 400 | 74 | 99 | 1 | 100 | 0.7 | Invention |
| 8 | A | 420 | 75 | 100 | 0 | 100 | 0.7 | Invention |
| 9 | B | 280 | 360 | 5 | 52 | 57 | 4.6 | Comparative |
| 10 | B | 300 | 95 | 16 | 54 | 70 | 2.2 | Comparative |
| 11 | B | 320 | 82 | 61 | 10 | 71 | 1.2 | Invention |
| 12 | B | 340 | 76 | 80 | 8 | 88 | 0.8 | Invention |
| 13 | B | 360 | 73 | 93 | 1 | 94 | 0.6 | Invention |
| 14 | C | 280 | 340 | 13 | 35 | 48 | 4.3 | Comparative |
| 15 | C | 380 | 93 | 35 | 34 | 69 | 2.5 | Comparative |
| 16 | D | 280 | 240 | 5 | 52 | 57 | 3.6 | Comparative |
| 17 | D | 300 | 190 | 7 | 49 | 56 | 3.1 | Comparative |
| 18 | D | 320 | 110 | 58 | 12 | 70 | 2.4 | Comparative |
| 19 | D | 340 | 98 | 60 | 8 | 68 | 2.2 | Comparative |

Comparing processing method A and processing method B, the two are about the same in the ratio between the preferentially <100> oriented region and the preferentially <212> oriented region of the interconnector for current collection. However, the center orientation (main orientation) of the crystal axes <100> in the preferentially <100> oriented region of the interconnector for current collection produced by processing method A coincided with the thickness direction and the longitudinal direction of the metal tape material, while the main orientation of the crystal axes <100> in the preferentially <100> oriented region of the interconnector for current collection produced by processing method B, although coinciding with the thickness direction of the metal tape material, deviated from the longitudinal direction by 5°. Although the ratio of the preferentially <100> oriented region and preferentially <212> oriented region of specimen 7 is indicated as 100%, and the preferentially <100> oriented region of specimen 8 is indicated as 100%, these are the results of rounding to the nearest whole number and they did not in fact totally occupy the two orientations.

The results set out in Table 1 show that by processing using a prescribed processing method and carrying out heat-treatment at or above a certain temperature, it was possible to realize an interconnector for current collection of a texture that is low in 0.2% proof stress of the metal tape material and small in the warp of the wafer to which the metal tape material is connected. On the other hand, it is shown that an interconnector for current collection of not greater the prescribed amount of warp could not be produced by the production method of processing method C that rolls from a round wire. This is because the introduction of strain by drawing was less suitable than rolling for growing the crystal axis <100> orientation after recrystallization.

Further, comparing processing method A and processing method D, it is seen that under the same heat-treatment conditions processing method A was able to fabricate a superior interconnector for current collection. This is because of the effect of imparting shear strain in the course of hot rolling. In addition, although the interconnector for current collection produced by method B was substantially the same as the interconnector for current collection produced by processing method A in preferentially <100> oriented region and preferentially <212> oriented region, the reason for the smaller amount of warp and superior properties exhibited was that the longitudinal direction and main orientation of the crystal axis <100> diverged 5°, and that the Schmid factor was small and longitudinal proof stress low.

From the results shown in Table 1, it was found that the texture of the metal tape material and the amount of warp are closely related, so that in order to reduce warp of the solar module wafer to below a prescribed amount, a metal tape material is preferable wherein the area fraction $A_1$ of the preferentially <100> oriented region in which the fundamental crystal axes <100> are respectively within an orientation difference of 15° relative to the thickness direction of the metal tape and one in-plane direction of the metal tape is 60% or greater and not greater than 100%, and, where the area fraction of the preferentially <212> oriented region in which the crystal axes <212> are respectively within an orientation difference of 15° relative to the thickness direction of the metal tape and one in-plane direction of the metal tape, is defined as $A_2$, the total of the area fraction of the preferentially <212> oriented region and the area fraction of the preferentially <100> oriented region, $A_1+A_2$, is greater than 70% and not greater than 100%.

Example 2

In this example, metal tape materials of copper were fabricated using 99.9% pure tough pitch copper sheet. In addition, the fabricated metal tape materials were used as solar module current-collection interconnectors and tests simulating their implementation were conducted.

The thickness of the fabricated metal tape materials was 160 μm, the same as in Example 1. Further, the processing method was the same as processing method A in Example 1. Using a tubular electric furnace, the processed metal tape materials were continuously heat-treated in an Ar gas stream at a flow velocity of 10 m/min. The heat treatment was conducted under a number of heat-treatment temperature conditions. Unlike in Example 1, no solder coating was performed in Example 2. Instead, at the time of linear mounting, the metal tape material and the solar cells were bonded through a 3-mm wide, 30-μm thick Sn—3.0 mass % Ag—0.5 mass % Cu solder ribbon.

As in Example 1, the solar module wafer of polycrystal silicon used for implementation and evaluation in a solar module was 156 mm square and 180 μm thick, and two parallel electrodes were provided in parallel with one side of the wafer to be symmetrical at an interval of 80 mm from the wafer center line. The electrodes were formed by baking on silver paste and had a thickness of about 10 μm. Linear mounting was carried out by welding (reflow) metal tape materials (interconnectors for current collection) to the wafer along the electrodes. Reflow was performed in an argon heat-treatment furnace with a load of 1 kPa applied onto the interconnectors for current collection disposed on the wafer. The reflow temperature was 250° C.

In Table 2 below, the area fraction $A_1$ of the preferentially <100> oriented region, the area fraction $A_2$ of the preferentially <212> oriented region, the sum thereof, $A_1+A_2$, the 0.2% proof stress, and the assessed warp are shown for the individual metal tape materials evaluated by the same methods as in Example 1. As in Example 1, ones with warp of 2.0 mm or less did not sustain breakage of the joints between the metal tape material and the solar module wafer or of the solar module wafer even when the warped region was forcibly flattened again. Based on this, ones with a warp amount of 2.0 mm or less were evaluated to be in a range posing no problem as a metal tape materials.

Although the area fraction $A_1$ of the preferentially <100> oriented region and the area fraction $A_2$ of the preferentially <212> oriented region were both calculated for two directions, i.e., the thickness direction and the rolling direction of the metal tape material, only the smaller of the values is shown in Table 2. It should be noted that in most cases the degree of integration of the crystal axis <100> and crystal axis <212> of the aggregate structure was greater in the rolling direction than in the thickness direction of the metal tape material. The area fractions calculated in this manner substantially coincided with the area fractions of the preferentially oriented regions in which the crystal axes of the individual unit lattices of the copper were within an orientation difference of 15° relative to the tape thickness direction and within an orientation difference of 15° relative to one in-plane direction of the tape material.

material is preferable wherein the area fraction $A_1$ of the preferentially <100> oriented region in which the fundamental crystal axes <100> are respectively within an orientation difference of 15° relative to the thickness direction of the metal tape and one in-plane direction of the metal tape is 60% or greater and not greater than 100%, and, where the area fraction of the preferentially <212> oriented region in which the crystal axes <212> are respectively within an orientation difference of 15° relative to the thickness direction of the metal tape and one in-plane direction of the metal tape, is defined as $A_2$, the total of the area fraction of the preferentially <212> oriented region and the area fraction of the preferentially <100> oriented region, $A_1+A_2$, is greater than 70% and not greater than 100%.

In this example, metal tape materials (cores) were fabricated using copper alloy and aluminum. In addition, the fabricated metal tape materials were used as solar module current-collection interconnectors and tests simulating their implementation were conducted.

The starting materials of the tape materials were pure aluminum of 99.99% purity, Cu—0.2% Ni alloy, and, for comparison, Cu—0.07% In alloy (99.93% purity as copper), and each was a thermo-ductile sheet having a thickness of 8 mm. These three types of starting materials were used to process metal tape materials by the following processing method E. The fabricated metal tape materials were metal tapes (flat wires) of 200 μm thickness×1.5 mm width.

In the fabrication by processing method E, 12-mm thick thermo-ductile sheets of the respective starting materials were rolled to 1.5 mm with a differential speed rolling mill at a 5% differential between the upper and lower rollers, and 300° C.×30 min intermediate heat treatment was next performed within an Ar gas stream in a batch furnace. This was followed by rolling to 200 μm in a cold-rolling mill and then slitting into 1.5-mm wide strips. Using a tubular electric furnace, the metal tape materials were thereafter continuously heat-treated in an Ar gas stream at a flow velocity of 10 m/min. The heat treatment temperature was 400° C. Following this, the metal tape material whose starting material was pure aluminum was electroless nickel plated to 0.2 μm thickness.

To use the aforesaid three types of metal tape materials as cores, their peripheries were plated to a thickness of 20 μm with Sn—1 mass % Cu solder by electroplating. The metal tape materials from the starting materials of pure aluminum of 99.99% purity, Cu—0.2% Ni alloy, and, for comparison,

TABLE 2

| Specimen no. | Processing method | Continuous heat-treatment temp. (° C.) | 0.2% proof stress (MPa) | Area fraction $A_1$ of preferentially <100> oriented region (%) | Area fraction $A_2$ of preferentially <212> oriented region (%) | $A_1 + A_2$ (%) | Warp (mm) | Remark |
|---|---|---|---|---|---|---|---|---|
| 20 | A | None | 330 | 5 | 54 | 59 | 3.9 | Comparative |
| 21 | A | 280 | 91 | 58 | 14 | 72 | 2.1 | Comparative |
| 22 | A | 300 | 82 | 61 | 11 | 72 | 1.9 | Invention |
| 23 | A | 320 | 85 | 85 | 8 | 93 | 0.9 | Invention |
| 24 | A | 340 | 72 | 93 | 4 | 97 | 0.8 | Invention |
| 25 | A | 360 | 69 | 98 | 1 | 99 | 0.7 | Invention |

From the results shown in Table 2, it was found that the texture of the metal tape material and the amount of warp are closely related, so that in order to reduce warp of the solar module wafer to below a prescribed amount, a metal tape Cu—0.07% In alloy obtained under the foregoing identical processing, heat treatment and solder plating conditions were respectively designated Specimen 26, Specimen 27 and Specimen 28.

The structures of the metal tape materials were analyzed by the aforesaid EBSD method (Electron Back-scattering Diffraction method) and evaluated. Unlike the X-ray diffraction method, the EBSD method enables analysis of three-dimensional crystal orientation from a single surface. The crystal orientation analysis of the metal tape material was performed at a widthwise middle region of the metal tape material which had been exposed by abrasion and polished to a final finish using colloidal silica. Further, the crystal orientation analysis was performed by analysis of an 800 μm×1600 μm region of the metal tape material at 1 to 4 μm intervals. The ratio (%) of the points where the crystal axes <100> and the crystal axes <212> respectively had orientations whose angles were within ±15° relative to the thickness direction and the rolling direction (longitudinal direction) of the metal tape material to all measured points was defined. The adequately large measured region and adequately fine measurement interval of the analysis make it possible to calculate the area fraction $A_1$ of the preferentially <100> oriented region and the area fraction $A_2$ of the preferentially <212> oriented region from the measured values. The 0.2% proof stress of the metal tape material was measured by tensile testing. Since the thickness and coating method of the solder layer were identical among all of the metal tape materials, difference in measured 0.2% proof stress can be said to be attributable to difference in the properties of the metal tape (core) material.

In Table 3, the area fraction $A_1$ of the preferentially <100> oriented region, the area fraction $A_2$ of the preferentially <212> oriented region, the sum thereof, $A_1+A_2$, the 0.2% proof stress, and the assessed warp are shown for the individual metal tape materials. Although the area fraction $A_1$ of the preferentially <100> oriented region and the area fraction $A_2$ of the preferentially <212> oriented region were both calculated for two directions, i.e., the thickness direction and the rolling direction of the metal tape material, only the smaller of the values is shown in Table 1. It should be noted that in most cases the degree of integration of the crystal axes <100> and crystal axes <212> of the aggregate structure was greater in the rolling direction than in the thickness direction of the metal tape material. The area fractions calculated in this manner substantially coincided with the area fractions of the preferentially oriented regions in which the crystal axes of the individual unit lattices of the copper were within an orientation difference of 15° relative to the tape thickness direction and within an orientation difference of 15° relative to one in-plane direction of the tape material. Further, ones with warp amount of 2.0 mm or less did not sustain breakage of the joints between the metal tape material and the solar module wafer or of the solar module wafer even when the warped region was forcibly made flat again. Based on this, ones with a warp amount of 2.0 mm or less were evaluated to be in a range posing no problem as a metal tape materials.

TABLE 3

| Specimen no. | Processing method | Continuous heat-treatment temp. (° C.) | 0.2% proof stress (MPa) | Area fraction $A_1$ of preferentially <100> oriented region (%) | Area fraction $A_2$ of preferentially <212> oriented region (%) | $A_1 + A_2$ (%) | Warp (mm) | Remark |
|---|---|---|---|---|---|---|---|---|
| 26 | E | 400 | 60 | 98 | 2 | 100 | 0.5 | Invention |
| 27 | E | 400 | 99 | 93 | 2 | 95 | 0.9 | Invention |
| 28 | E | 400 | 130 | 50 | 11 | 61 | 3.8 | Comparative |

The solar module wafer of polycrystal silicon used for implementation and evaluation in a solar module was 156 mm square and 200 μm thick, and two parallel electrodes were provided in parallel with one side of the wafer to be symmetrical at an interval of 80 mm from the wafer center line. The electrodes were formed by baking on silver paste and had a thickness of about 10 μm. Linear mounting was carried out by welding (reflow) metal tape materials (interconnectors for current collection) to the wafer along the electrodes. Reflow was performed in an argon heat-treatment furnace with a load of 1 kPa applied onto the interconnectors for current collection disposed on the wafer. The reflow temperature at this time was 250° C.

The linear mounting was followed by spontaneous cooling to room temperature (25° C.), whereafter the load was removed. As a result, the wafer was observed to warp in the linear mounting L direction inward on the metal tape material side. This was caused by the difference in amount of thermal contraction that occurred during the post-reflow spontaneous cooling to room temperature as a result of the metal tape material having a larger coefficient of thermal expansion than the polycrystal silicon solar module wafer. The degree of warping differed considerably depending on the metal tape material. It should be noted that the degree of warping was evaluated using the maximum height difference of the wafer as the warp amount.

From the results shown in Table 3, it was found that insofar as the conditions of the present invention are met, a metal tape material that is low in yield stress and capable of lowering thermal strain at the time of linear mounting can be realized even without high-purity copper. Although aluminum is higher in electrical resistance than pure copper, it can be said to be useful in applications where small current density suffices. Further, even copper containing many impurities, insofar as it can be given the structural morphology taught by the present invention, can be made into a metal tape material of small proof stress useful as a solar module current-collection interconnector.

Example 4

Copper metal tape materials were fabricated using 99.9% pure tough pitch copper as starting material, their structures were evaluated, and their performance as tape conductors for semiconductor mounting was evaluated. The tough pitch copper used in the metal tape materials was a 330 mm wide, 30 mm thick base metal of JIS C1100 O Class. This base metal was hot rolled at a maximum temperature of 600° C. to a width of 400 mm and thickness of 25 mm. It was then cold rolled to a thickness of 20 mm after turning the rolling direction 90°. It was additionally rolled to a prescribed thickness with a differential speed rolling mill at a 5% differential between the upper and lower rollers, and intermediate heat treated for 30 min in an Ar gas stream in a batch furnace. Next, it was cold rolled to 150 μm in a cold rolling mill. Next, copper tape materials were fabricated by slitting into 1.5-mm wide strips. Next, metal tape materials were produced as solder plated flat copper wires coated with solder to 30 μm thickness by hot-dipping. The solder material was Sn—1.2 mass % Ag—0.5 mass % Cu—0.05 mass % Ni.

The heat-treatment temperature in the argon gas stream in the batch furnace was set at two levels, 400° C. and 800° C. Although the intermediate materials after heat treatment differed in grain diameter, they totally recrystallized at both temperatures. Flat copper wires with various tough pitch copper core structures were obtained by varying this intermediate heat-treatment temperature and the cold-working degree to 0.15 mm in the processing that followed.

The hot-dipping was conducted using a continuous roll-to-roll plating furnace comprising a bright annealing furnace and a hot-dip plating furnace. A 0.15-mm thick, 1.5-mm wide tough pitch copper core was passed through the interior of the tubular bright annealing furnace carrying a stream of nitrogen gas containing 5% hydrogen at the speed of 10 m/min. Next, the tough pitch copper core was immediately passed through the hot-dip plating bath without entering the atmosphere. The temperature of the bright annealing furnace was 600° C., and the temperature of the hot-dip bath was 300° C.

The structure of the metal tape material was analyzed and evaluated using the EBSD method (Electron Back-scattering Diffraction method). Unlike the X-ray diffraction method, the EBSD method enables analysis of three-dimensional crystal orientation from a single surface. The crystal orientation analysis of the metal tape material was performed at a widthwise middle region of the metal tape material which had been exposed by abrasion and polished to a final finish using colloidal silica. Further, the crystal orientation analysis was performed by analysis of an 800 μm×1600 μm region of the metal tape material at 1 to 4 μm intervals. The ratio (%) of the points where the crystal axes <100> and the crystal axes <212> respectively had orientations whose angles were within ±15° relative to the thickness direction and the rolling direction (longitudinal direction) of the metal tape material to all measured points was defined. The adequately large measured region and adequately fine measurement interval of the analysis make it possible to calculate the area fraction $A_1$ of the preferentially <100> oriented region and the area fraction $A_2$ of the preferentially <212> oriented region from the measured values. The 0.2% proof stress and break elongation of the metal tape material were measured with a tensile testing machine, and measurement was done under conditions of a gauge length of 100 mm and tensile speed of 10 mm/min. The average of the values measured for seven tape materials was used as the measured value.

Since the thickness and coating method of the solder layer were identical, difference in measured 0.2% proof stress can be said to be attributable to difference in the properties of the metal tape (core) material.

The solar module wafer of polycrystal silicon used for implementation and evaluation in a solar module was 125 mm square and 150 μm thick, and two parallel electrodes were provided in parallel with one side of the wafer to be symmetrical at an interval of 60 mm from the wafer center line. The electrodes were formed by baking on silver paste and had a thickness of about 20 μm. Linear mounting was carried out by welding (reflow) metal tape materials (interconnectors for current collection) to the wafer along the electrodes. Reflow was performed in an argon heat-treatment furnace with a load of 1 kPa applied onto the interconnectors for current collection disposed on the wafer. The reflow temperature at this time was 255° C.

The linear mounting was followed by spontaneous cooling to room temperature (25° C.), whereafter the load was removed. As a result, the wafer was observed to warp in the linear mounting L direction inward on the metal tape material side. This was caused by the difference in amount of thermal contraction that occurred during the post-reflow spontaneous cooling to room temperature as a result of the metal tape material having a larger coefficient of thermal expansion than the polycrystal silicon solar module wafer. The degree of warping differed considerably depending on the metal tape material. It should be noted that the degree of warping was evaluated using the maximum height difference of the wafer as the warp amount.

Table 4 shows the intermediate heat treatment temperature and ensuing cold rolling reduction of the individual metal tape materials, and the area fraction $A_1$ of the preferentially <100> oriented region, the area fraction $A_2$ of the preferentially <212> oriented region, the sum thereof, $A_1+A_2$, the 0.2% proof stress, and the break elongation ratio of the individual metal tape materials. In order to achieve more desirable ranges, as regards the area fractions of the preferentially oriented regions, the area fractions (%) where the crystal axes <100> and <212> of the unit lattice were within an orientation difference of 15° relative to the thickness direction of the tape material and further within an orientation difference of 15° relative to one in-plane direction of the tape material were calculated and rounded to one decimal place. In this example, one orientation of the crystal axes of the unit lattice substantially coincided with the longitudinal direction, i.e., the final cold rolling direction.

TABLE 4

| Specimen no. | Intermediate anneal temp. (° C.) | Sheet thickness before final cold rolling (mm) | Cold working degree (%) | 0.2% proof stress (MPa) | Break elongation (%) | (1) Preferentially <100> oriented region (%), $A_1$ | (2) Preferentially <212> oriented region (%), $A_2$ | (1) + (2) (%) | Warp (mm) | Remark |
|---|---|---|---|---|---|---|---|---|---|---|
| 29 | 400 | 0.2 | 25.00 | 120.1 | 12.0 | 4.0 | 53.0 | 57.0 | 2.3 | Comparative |
| 30 | 400 | 0.3 | 50.00 | 101.8 | 18.0 | 15.0 | 54.0 | 69.0 | 2.1 | Comparative |
| 31 | 400 | 0.4 | 62.50 | 85.1 | 26.0 | 61.0 | 10.5 | 71.5 | 1.4 | Invention |
| 32 | 400 | 0.5 | 70.00 | 79.5 | 36.0 | 65.2 | 10.1 | 75.3 | 0.9 | Invention |
| 33 | 400 | 0.7 | 78.57 | 70.3 | 38.0 | 72.6 | 4.5 | 77.1 | 0.7 | Invention |
| 34 | 400 | 0.9 | 83.33 | 62.1 | 42.0 | 88.9 | 4.1 | 93.0 | 0.5 | Invention |
| 35 | 400 | 1.0 | 85.00 | 61.8 | 41.0 | 93.0 | 2.6 | 95.6 | 0.6 | Invention |
| 36 | 400 | 1.5 | 90.00 | 61.9 | 38.0 | 98.5 | 1.2 | 99.7 | 0.5 | Invention |
| 37 | 400 | 5.0 | 97.00 | 62.2 | 39.0 | 99.5 | 0.3 | 99.8 | 0.6 | Invention |

TABLE 4-continued

| Specimen no. | Intermediate anneal temp. (° C.) | Sheet thickness before final cold rolling (mm) | Cold working degree (%) | 0.2% proof stress (MPa) | Break elongation (%) | (1) Preferentially <100> oriented region (%), $A_1$ | (2) Preferentially <212> oriented region (%), $A_2$ | (1) + (2) (%) | Warp (mm) | Remark |
|---|---|---|---|---|---|---|---|---|---|---|
| 38 | 400 | 15.0 | 99.00 | 62.1 | 37.0 | 99.8 | 0.2 | 100.0 | 0.6 | Invention |
| 39 | 400 | 18.0 | 99.17 | 62.3 | 28.3 | 100.0 | 0.0 | 100.0 | 0.6 | Invention |
| 40 | 800 | 0.9 | 83.33 | 68.0 | 30.2 | 67.0 | 12.0 | 79.0 | 0.9 | Invention |
| 41 | 800 | 1.0 | 85.00 | 79.9 | 19.0 | 65.1 | 12.1 | 77.2 | 1.3 | Invention |
| 42 | 800 | 0.5 | 70.00 | 92.3 | 15.0 | 48.7 | 21.7 | 70.4 | 1.6 | Comparative |

From the results shown in Table 4, it was found that by carrying out production under specific intermediate heat treatment temperature and working conditions, flat copper tape materials differing in 0.2% proof stress and break elongation can be obtained even when the final heat treatment conditions are the same. In addition, it was found by tests simulating wire bonding of the respective materials to solar module current-collection interconnectors that the amount of warp occurring in the semiconductor wafer differs from one material to another. This is because the cores of the materials differed in structure.

Wafers that sustained warping were forcibly flattened by pressing a flat plate onto the warped region. The result was that semiconductor wafers whose warping exceeded 1.6 mm experienced local cracking of the semiconductor wafer and detachment at the interface between the baked silver paste of the metal tape material and the semiconductor wafer. Pass/fail as a material for an interconnector for current collection was therefore judged using 1.5 mm warp as the criterion.

The structure meeting the criterion of 1.5 mm warp was found to be: The area fraction $A_1$ of the preferentially <100> oriented region in which crystal axes <100> of the unit lattice are within an orientation difference of 15° relative to the thickness direction of the metal tape material and further within an orientation difference of 15° relative to the longitudinal direction of the metal tape material is 60% or greater and not greater than 100%, and, where the area fraction in which crystal axes <212> are within an orientation difference of 15° relative to the thickness direction of the metal tape material and further within an orientation difference of 15° relative to the longitudinal direction of the metal tape material is defined as $A_2$, the total of the area fraction of the preferentially <212> oriented region and the area fraction of the preferentially <100> oriented region, $A_1+A_2$, is greater than 70% and not greater than 100%.

As the preferentially <100> oriented region is very highly developed in the metal tape having such structure, the crystal grains of the same orientation coalesce to coarsen the grain size. The yield force of the metal tape material at the time of plastic deformation by the stress occurring during cooling after solder melting is therefore small because dislocations are less likely to be constrained by the grain boundaries. In the case where crystal grains merge to behave like a single grain, two axes of the <100> axis are desirably aligned.

The structures of the metal tape materials fabricated in Examples 1 to 4 were investigated using the results of analysis by the EBSD method. The result was that when the area fraction $A_1$ of the preferentially <100> oriented region where the crystal axes <100> of the unit lattice were within an orientation difference of 15° relative to the thickness direction of the metal tape material and further within an orientation difference of 15° relative to the longitudinal direction of the metal tape material was 60% or greater, the <100> crystal grains forming the preferentially <100> oriented region passed from one metal tape surface of the metal tape core through to the other metal tape surface. The in-plane grain size of the <100> crystal grains was 400 μm or greater. Even if crystal grains of a different orientation are contained internally, insofar as included in one <100> crystal grain in the tape plane, the grain size of the <100> crystal grains was deemed to be the size of the crystal of different orientation. Here, the crystal grain size of the phase having a different orientation contained inside the <100> crystal grains was 10 μm or less.

Most of the crystals differing in orientation contained internally had a crystallographic orientation in which the crystal axes <212> of the unit lattice had an orientation difference within 15° relative to the thickness direction of the metal tape material and further had an orientation difference within 15° relative to one in-plane direction of the metal tape material. It was found that particularly when the area fraction $A_2$ of the phase having this crystallographic orientation was 0.2% or greater to not greater than 10% and the total $A_1+A_2$ of the area fraction of this preferentially <212> oriented region and the area fraction of the preferentially <100> oriented region was greater than 70% and not greater than 100%, more desirable mechanical properties were possessed as a tape conductor material for semiconductor packaging with small 0.2% proof stress and large break elongation.

Figure 3:
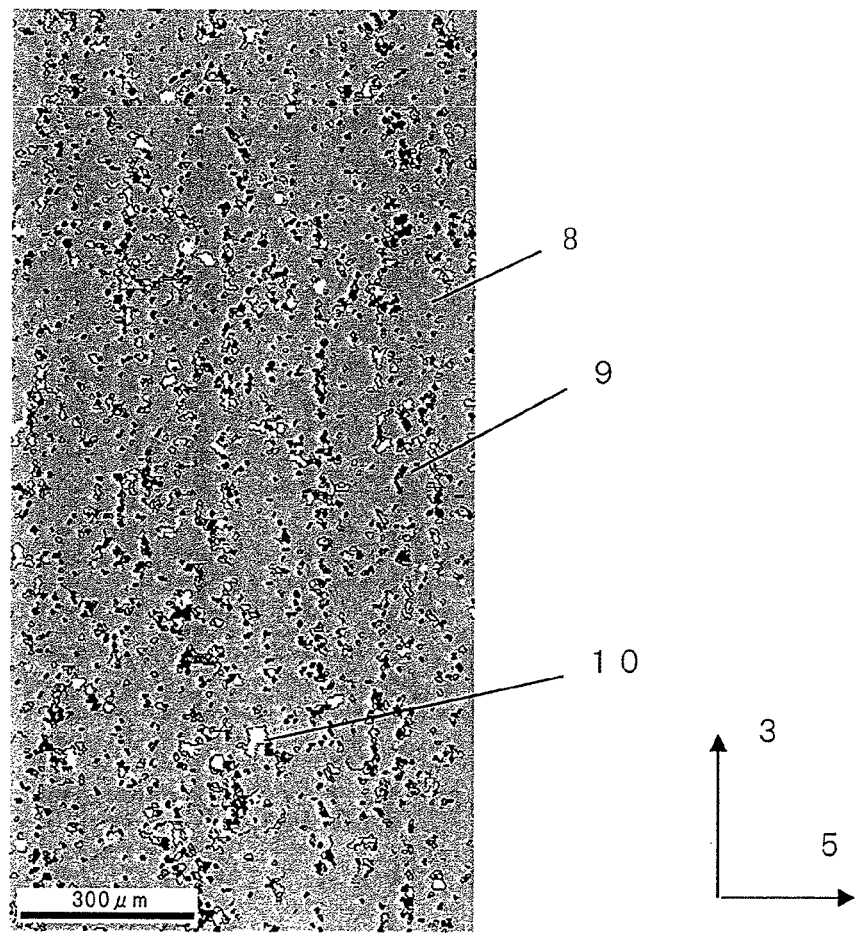
FIG. 3 shows an example of the broadside in-plane structure of a metal tape material of an embodiment according to the present invention.

FIG. 3 is an image showing the broadside in-plane structure of the copper tape surface of the material of specimen no. 34 with the individual crystallographic orientations color-coded in gray-scale. The material of specimen no. 34 was the smallest in 0.2% proof stress and largest in break elongation in Example 3. The material of specimen no. 34 can therefore be said to have the most desirable mechanical properties as a tape conductor material for semiconductor packaging. The size of the field of view in FIG. 3 is 800 μm×1600 μm, and the long side direction is the L direction 3 of the interconnector for current collection. Further, the short side direction is the W direction 5 of the interconnector for current collection.

A preferentially <100> oriented region 8 in which crystal axes <100> of the unit lattice are within an orientation difference of 15° relative to the thickness direction of the metal tape material and further within an orientation difference of 15° relative to the longitudinal direction of the metal tape material is indicated in gray. A preferentially <212> oriented region 9 in which crystal axes <100> of the unit lattice are within an orientation difference of 15° relative to the thickness direction of the metal tape material and further within an orientation difference of 15° relative to the longitudinal direction of the metal tape material is indicated in black. A region 10 facing in another orientation from these is indicated in white. Further, a grain boundary 11 is indicated by a solid line. As shown in Table 4, the area fraction $A_1$ of the preferentially <100> oriented region is 88.9% and area fraction $A_2$ of the preferentially <212> oriented region is 4.1%.

The crystal grain constituting the preferentially <100> oriented region 8 contains a phase having a crystal grain of another orientation inside the crystal grain. The specimen of specimen no. 34 shown in FIG. 3, while partially grain boundary, is totally covered by the preferentially <100> oriented region 8, and the specimen can be considered a single crystal grain. The grain size of the crystal grain therefore has a magnitude of 800 μm×1600 μm or greater in the tape in-plane direction. Further, this crystal grain passed through from one surface to the other surface of the specimen of specimen no. 34. As a result of this, the 0.2% proof stress of this material was small. Further, the reason for the break elongation of this material being large is that the phase 9 of a crystal grain size of 30 μm or less having <212> orientation was contained as dispersed in the preferentially <100> oriented region 8.

Example 5

Since the material of the present invention demonstrated excellent effects as a current-collection interconnector for a crystal-type solar module, the structure and mechanical properties of interconnectors for current collection used in commercially available crystal-type solar panels were investigated.

To avoid loss of structural and mechanical properties, no thermal or mechanical load acts on an interconnector for current collection. First, a water jet was used to cut a piece of current-collection interconnector of 10-mm width, 150-mm length from a solar panel as a single unit including the light-receiving side glass around the current-collection interconnector together with the plastic sheet on the rear side. This rigid piece was immersed in n-propyl bromide to dissolve the materials surrounding the interconnector for current collection and extract a current-collection interconnector segment measuring 150 mm in length.

The structures of the extracted interconnectors for current collection were analyzed by the EBSD method (Electron Back-scattering Diffraction method) and evaluated. Unlike the X-ray diffraction method, the EBSD method enables analysis of three-dimensional crystal orientation from a single surface. The crystal orientation analysis of the metal tape material was performed at a widthwise middle region of the metal tape material which had been abraded to expose the copper and polished to a final finish using colloidal silica. Further, the crystal orientation analysis was performed by analysis of an 800 μm×1600 μm region of the metal tape material at 1 to 4 μm intervals. The ratio (%) of the points where the crystal axes <100> and the crystal axes <212> respectively had orientations whose angles were within ±15° relative to the thickness direction and the rolling direction (longitudinal direction) of the metal tape material to all measured points was defined. The adequately large measured region and adequately fine measurement interval of the analysis make it possible to calculate the area fraction $A_1$ of the preferentially <100> oriented region and the area fraction $A_2$ of the preferentially <212> oriented region from the measured values. The 0.2% proof stress and break elongation of the metal tape material were measured with a tensile testing machine, and measurement was done under conditions of a gauge length of 100 mm and tensile speed of 10 mm/min. The average of the values measured for seven tape materials was used as the measured value.

In Table 5 below, the area fraction $A_1$ of the preferentially <100> oriented region, the area fraction $A_2$ of the preferentially <212> oriented region, the sum thereof, $A_1+A_2$, the 0.2% proof stress, and the break elongation are shown for the individual interconnectors for current collection.

TABLE 5

| Specimen no. | 0.2% proof stress (MPa)) | Break elongation (%)) | (1) Preferentially <100> oriented region (%), $A_1$ | (2) Preferentially <212> oriented region (%), A | (1) + (2) (%)) | Remark |
|---|---|---|---|---|---|---|
| 43 | 100.4 | 15.2 | 1.2 | 18.4 | 19.6 | Comparative |
| 44 | 125.2 | 17.4 | 2.4 | 10.9 | 13.3 | Comparative |
| 45 | 113.3 | 17.1 | 2.4 | 13.7 | 16.1 | Comparative |
| 46 | 93.4 | 17.0 | 1.1 | 23.0 | 24.1 | Comparative |
| 47 | 108.9 | 13.6 | 14.3 | 12.2 | 26.5 | Comparative |
| 48 | 102.4 | 11.5 | 24.8 | 16.0 | 40.8 | Comparative |
| 49 | 98.9 | 17.1 | 27.9 | 19.2 | 47.1 | Comparative |
| 50 | 108.1 | 12.3 | 4.5 | 8.2 | 12.7 | Comparative |
| 51 | 107.8 | 14.5 | 1.5 | 10.0 | 11.5 | Comparative |

All of the interconnectors for current collection were small in area fraction $A_1$ of the preferentially <100> oriented region and large in 0.2% proof stress in comparison to materials in the range of the present invention. Further, break elongation exhibited low values.

Figure 4:
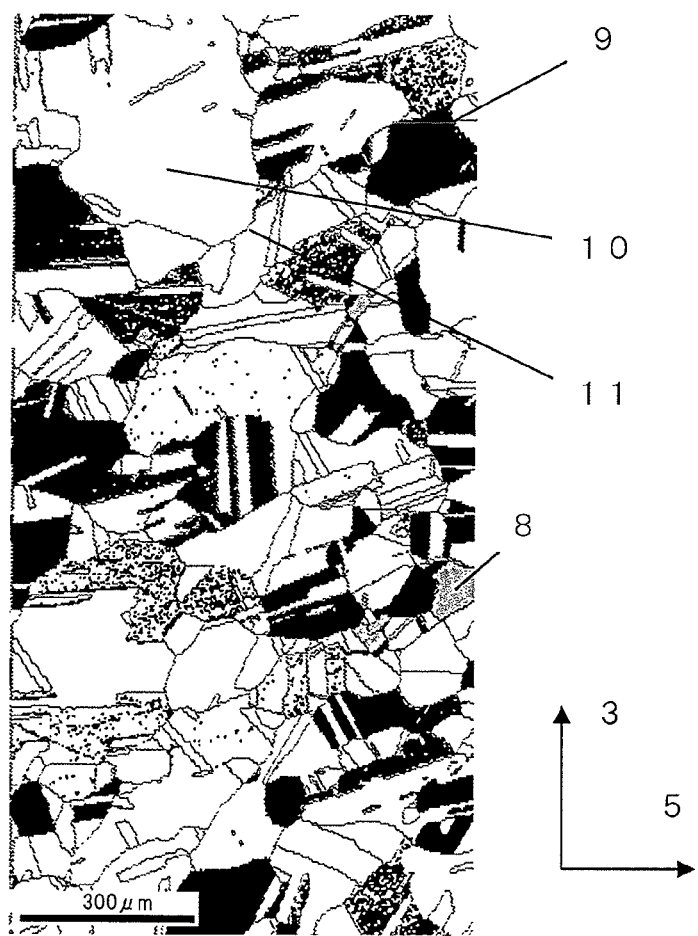
FIG. 4 shows an example of the broadside in-plane structure of a solar module interconnector for current collection that is a comparative example with respect to the solar module interconnector for current collection according to the present invention.
Figure 5:
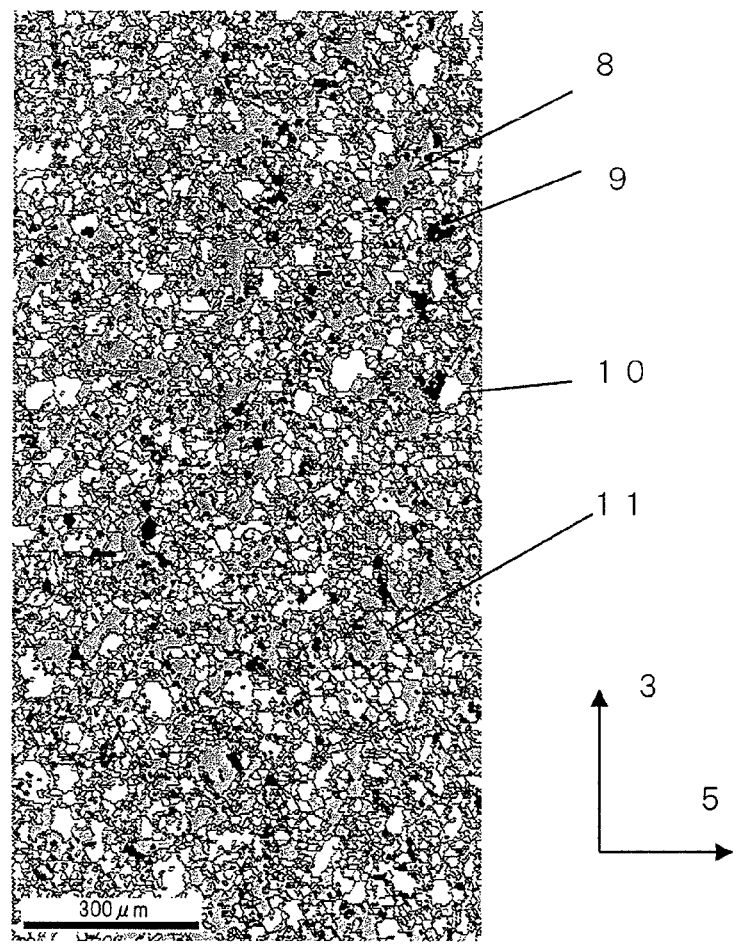
FIG. 5 shows another example of the broadside in-plane structure of a solar module interconnector for current collection that is a comparative example with respect to the solar module interconnector for current collection according to the present invention.

FIG. 4 and FIG. 5 are images showing the broadside in-plane structures of the interconnectors for current collection of specimen no. 46 and specimen no. 49, respectively, as obtained by analyzing the EBSD results. The size of the field of view is 800 μm×1600 μm, and the long side direction is the L direction 3 of the interconnector for current collection. Further, the short side direction is the W direction 5 of the interconnector for current collection.

A preferentially <100> oriented region 8 in which crystal axes <100> of the unit lattice are within an orientation difference of 15° relative to the thickness direction of the metal tape material and further within an orientation difference of 15° relative to the longitudinal direction of the metal tape material is indicated in gray. A preferentially <212> oriented region 9 in which crystal axes <100> of the unit lattice are within an orientation difference of 15° relative to the thickness direction of the metal tape material and further within an orientation difference of 15° relative to the longitudinal direction of the metal tape material is indicated in black. A region 10 facing in another orientation from these is indicated in white. Further, a grain boundary 11 is indicated by a solid line.

In this example, specimen no. 46 was the smallest in 0.2% proof stress. However, the 0.2% proof stress of specimen no.

46 was large in comparison to the 0.2% proof stress of the interconnectors for current collection of the present invention. This was because the area fraction $A_1$ of the preferentially <100> oriented region was underdeveloped and large crystal grains were not formed. Further, specimen no. 49 is the specimen in which the area fraction $A_1$ of the preferentially <100> oriented region was largest. However, the area fraction $A_1$ of the preferentially <100> oriented region did not grow to the prescribed value of the present invention. Further, the crystal grain diameter of specimen no. 49 is small even in comparison to the grain diameter of specimen no. 46. As a result, the 0.2% proof stress of specimen no. 49 exhibited a high value. This is the result of the yield stress becoming large because deformation was constrained by grain boundaries in accordance with the Hall-Petch relation.

The interconnectors for current collection studied in the example were all polycrystalline substances. Although the specimen of specimen no. 46 had the largest broadside in-plane crystal grain diameter, the equivalent circular diameter of the grain diameter was 300 μm or less. From this it can be said that the metal tape material of the present invention is a material having a distinctive structure and excellent mechanical properties as a solar module interconnector for current collection.

EXPLANATION OF REFERENCE SYMBOLS

1 Solar cell
2 Interconnector for current collection
3 L direction
4 D direction
5 W direction
6 Metal core
7 Electrically conductive bonding agent
8 Preferentially <100> oriented region
9 Preferentially <212> oriented region
10 Region other than regions formed by preferentially <100> oriented region and preferentially <212> oriented region
11 Crystal grain boundary (high-angle grain boundary)

The invention claimed is:

1. A metal tape material comprising a metal whose crystal structure is face centered cubic lattice structure,
wherein an area fraction $A_1$ of a <100> oriented region in which crystal axes <100> of a unit lattice of the face centered cubic structure are within an orientation difference of 15° relative to a thickness direction of the metal tape material and further within an orientation difference of 15° relative to a first in-plane direction of the metal tape material is 60% or greater and not greater than 100%, and,
wherein an area fraction of a <212> noriented region in which crystal axes <212> of the unit lattice of the face centered cubic structure are within an orientation difference of 15° relative to the thickness direction of the metal tape material and further within an orientation difference of 15° relative to the first in-plane direction of the metal tape material is defined as $A_2$, the total of the area fraction of the <212> oriented region and the area fraction of the <100> oriented region, $A_1+A_2$, is greater than 70% and not greater than 100%,
wherein the crystal grain size of the crystal grains in an in-plane direction of the metal tape material is 400 μm or greater,
wherein the metal is copper, silver, aluminum, or gold,
wherein the area fraction $A_1$ is not greater than 99.8% and the area fraction $A_2$ is 0.2% or greater, and
wherein the first direction is the longitudinal direction of the metal tape material.

2. The metal tape material as set out in claim 1,
wherein crystal grains constituting the <100> oriented region form at least part of each of a top surface and an under surface of the metal tape material, and
the crystal grains have a structure in which the crystal grains constituting the <212>oriented region are dispersed internally.

3. The metal tape material as set out in claim 1, wherein the metal is copper of a purity of 99.9% or greater.

4. The metal tape material as set out in claim 1, wherein the surface is coated with a metal of a melting point of 250° C. or less.

5. An interconnector for solar module current collection, comprising:
a metal tape material as set out in claim 1 whose width is 1 mm or greater and not greater than 5 mm and thickness is greater than 50 μm and not greater than 300μm.

6. A metal tape material comprising a metal whose crystal structure is face centered cubic lattice structure,
wherein an area fraction $A_1$ of a <100> oriented region in which crystal axes <100> of a unit lattice of the face centered cubic structure are within an orientation difference of 15° relative to a thickness direction of the metal tape material and further within an orientation difference of 15° relative to a first in-plane direction of the metal tape material is 60% or greater and not greater than 100%,
wherein an area fraction of a <212> oriented region in which crystal axes <212> of the unit lattice of the face centered cubic structure are within an orientation difference of 15° relative to the thickness direction of the metal tape material and further within an orientation difference of 15° relative to the first in-plane direction of the metal tape material is defined as $A_2$, the total of the area fraction of the <212> oriented region and the area fraction of the <100> oriented region, $A_1+A_2$, is greater than 70% and not greater than 100%,
wherein the area fraction $A_1$ is 65% or greater and not greater than 99.8%, the area fraction $A_2$ is 0.2% or greater and not greater than 12%,
wherein the metal is copper, silver, aluminum, or gold, and
wherein the first direction is the longitudinal direction of the metal tape material.

* * * * *